United States Patent
Okita et al.

(10) Patent No.: US 11,152,499 B2
(45) Date of Patent: Oct. 19, 2021

(54) NITRIDE SEMICONDUCTOR DEVICE AND METHOD FOR MANUFACTURING SAME

(71) Applicant: Panasonic Intellectual Property Management Co., Ltd., Osaka (JP)

(72) Inventors: Hideyuki Okita, Toyama (JP); Manabu Yanagihara, Osaka (JP); Takahiro Sato, Toyama (JP); Masahiro Hikita, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 124 days.

(21) Appl. No.: 16/575,075

(22) Filed: Sep. 18, 2019

(65) Prior Publication Data

US 2020/0105917 A1 Apr. 2, 2020

(30) Foreign Application Priority Data

Sep. 27, 2018 (JP) .............................. JP2018-182424

(51) Int. Cl.
*H01L 29/205* (2006.01)
*H01L 29/778* (2006.01)
(Continued)

(52) U.S. Cl.
CPC ...... *H01L 29/7787* (2013.01); *H01L 21/0254* (2013.01); *H01L 29/2003* (2013.01); *H01L 29/205* (2013.01); *H01L 29/207* (2013.01); *H01L 29/36* (2013.01); *H01L 29/41758* (2013.01); *H01L 29/432* (2013.01); *H01L 29/66462* (2013.01); *H01L 21/0262* (2013.01); *H01L 21/0274* (2013.01);
(Continued)

(58) Field of Classification Search
CPC ............ H01L 29/0619; H01L 29/1066; H01L 29/2003; H01L 29/205; H01L 29/207; H01L 29/32; H01L 29/36; H01L 29/432; H01L 29/7787
USPC .......................................................... 257/76
See application file for complete search history.

(56) References Cited

U.S. PATENT DOCUMENTS

2007/0278521 A1* 12/2007 Ishida .................... H01L 29/432
257/192
2011/0260217 A1* 10/2011 Okamoto .......... H01L 29/41766
257/194

(Continued)

FOREIGN PATENT DOCUMENTS

WO 2014/174810 A1 10/2014

*Primary Examiner* — Long K Tran
(74) *Attorney, Agent, or Firm* — McDermott Will & Emery LLP

(57) ABSTRACT

A nitride semiconductor device includes: a substrate; a first nitride semiconductor layer; a second nitride semiconductor layer having a greater band gap than the first nitride semiconductor layer; a source electrode and a drain electrode on the second nitride semiconductor layer apart from each other; a third nitride semiconductor layer, between the source electrode and the drain electrode, containing a p-type first impurity and serving as a gate; and a fourth nitride semiconductor layer, between the third nitride semiconductor layer and the drain electrode, containing a p-type second impurity, wherein the average carrier concentration of the fourth nitride semiconductor layer is lower than the average carrier concentration of the third nitride semiconductor layer.

18 Claims, 10 Drawing Sheets

(51) Int. Cl.
  *H01L 29/417* (2006.01)
  *H01L 29/36* (2006.01)
  *H01L 29/207* (2006.01)
  *H01L 29/66* (2006.01)
  *H01L 21/02* (2006.01)
  *H01L 29/43* (2006.01)
  *H01L 29/20* (2006.01)
  H01L 21/306 (2006.01)
  H01L 21/223 (2006.01)
  H01L 21/027 (2006.01)

(52) U.S. Cl.
  CPC .... *H01L 21/02381* (2013.01); *H01L 21/2233* (2013.01); *H01L 21/2236* (2013.01); *H01L 21/30621* (2013.01)

(56) References Cited

U.S. PATENT DOCUMENTS

2014/0264441 A1* 9/2014 Murase ............. H01L 29/66462
  257/190
2016/0035853 A1 2/2016 Kaneko et al.

* cited by examiner

NITRIDE SEMICONDUCTOR DEVICE AND METHOD FOR MANUFACTURING SAME

CROSS REFERENCE TO RELATED APPLICATION

This application claims the benefit of priority of Japanese Patent Application Number 2018-182424 filed on Sep. 27, 2018, the entire content of which is hereby incorporated by reference.

BACKGROUND

1. Technical Field

The present disclosure relates to a structure of a semiconductor device and a method for manufacturing the semiconductor device, and more specifically to a device using a semiconductor, a group-III nitride semiconductor in particular, which can be used as, for example, a power transistor and a method for manufacturing the device.

2. Description of the Related Art

A group-III nitride semiconductor has a wide band gap and thus a high dielectric breakdown voltage. The group-III nitride semiconductor can also easily form a heterostructure of, for example, AlGaN and GaN, can generate an electron channel (two-dimensional electron gas 2 DEG) with high mobility and a high concentration on a GaN layer side of an AlGaN/GaN interface due to piezo charges generated from a lattice constant difference between an AlGaN barrier layer and a GaN channel layer and due to a band gap difference, and can control the 2 DEG to thereby form a high-electron mobility transistor (HEMT). With the aforementioned features such as a high voltage, a high speed, and a large current, the group-III nitride semiconductor is applied to electronic devices such as field-effect transistors (FET) for power applications and diodes.

Upon use of the group-III nitride semiconductor (of, for example, GaN) for the FET for the power application, required in view of safety is normally-OFF operation in which no current flows between a source and a drain when a gate voltage is 0V. To cause a GaN-FET to perform the normally-OFF operation, a p-type group-III nitride semiconductor is provided between a gate electrode and the AlGaN barrier layer, thereby forming a p-n junction under a gate and depleting only the 2 DEG channel located under the gate.

In a semiconductor device described in FIG. 2 of International Publication WO2014/174810, a first nitride semiconductor layer (of, for example, GaN) serving as a channel layer is on an appropriate substrate (of, for example, Si), further on which a second nitride semiconductor layer (of, for example, AlGaN) serving as a barrier layer having a greater band gap than the first nitride semiconductor layer is provided. Consequently, a two-dimensional electron gas (2 DEG) layer is generated in the first nitride semiconductor layer near an interface formed with the second nitride semiconductor layer due to a band gap difference between the second nitride semiconductor layer and the first nitride semiconductor layer and due to piezo charges generated in the second nitride semiconductor layer.

A source electrode and a drain electrode which make ohmic contact with the second nitride semiconductor layer are on the second nitride semiconductor layer apart from each other. Two electrode parts (of, for example, p-GaN) are between the source electrode and the drain electrode apart from each other, and the electrode part located closely to the source electrode is used as a gate electrode while the electrode part located closely to the drain electrode and the drain electrode are electrically connected to each other and have substantially same potential. The aforementioned semiconductor device is an FET which can be controlled by a voltage with which a drain current flowing between the source electrode and the drain electrode is applied to the gate electrode part.

According to International Publication WO2014/174810, as a result of providing the electrode part (of, for example, p-GaN) on a drain electrode side independently from the gate electrode part (of, for example, p-GaN), application of a positive voltage to the drain electrode part causes hole implantation from a drain side, which can neutralize electrons trapped in the nitride semiconductor layer or at a surface level and can suppress generation of current collapse. The current collapse is a phenomenon in which upon application of a high voltage to a drain electrode while an FET is in an OFF state, as a result of trapping electrons to, for example, a defect or a surface level in a crystal, the trapped electrons are not removed even in an ON state and a 2 DEG channel is closed by a depletion layer generated by the aforementioned electrons, reducing a drain current and deteriorating an ON resistance.

SUMMARY

However, the semiconductor device described in International Publication WO2014/174810 faces a following problem.

With the structure described in FIG. 2 of International Publication WO2014/174810, in a case where p-GaN is used for the gate electrode part and the drain electrode side electrode part, for the purpose of causing the gate electrode part to perform normally-OFF operation, the second nitride semiconductor layer (of, for example, AlGaN) located immediately under the gate electrode part needs to be thinned to some extent (approximately 20 nm or less in case of AlGaN where Al composition is 20%) to deplete the 2 DEG by the p-n junction. However, thinning even the second nitride semiconductor layer located immediately under the drain electrode part in a similar manner depletes even an area immediately under the drain electrode part, which deteriorates the ON resistance.

International Publication WO2014/174810 discloses, as countermeasures against the aforementioned problem, resolution in which a recess part is provided in the second nitride semiconductor layer (of, for example, AlGaN) located immediately under the gate electrode part as illustrated in FIG. 26 of International Publication WO2014/174810, whereby the normally-OFF operation is caused immediately under the gate electrode and a sufficient thickness is also provided to the second nitride semiconductor layer (of, for example, AlGaN) located immediately under drain electrode side p-GaN, thereby causing normally-ON operation.

However, providing the recess part at the second nitride semiconductor layer (of, for example, AlGaN) located immediately under the gate electrode part brings about a problem that, in a case where the electrode part is of, for example, p-GaN, the p-GaN needs to be formed through epitaxial regrowth after the formation of the recess part, which complicates processes and increases process costs.

A nitride semiconductor device according to one aspect of the present disclosure includes: a substrate; a first nitride semiconductor layer on the substrate; a second nitride semiconductor layer, on the first nitride semiconductor layer, having a greater band gap than the first nitride semiconductor layer; a source electrode and a drain electrode on the second nitride semiconductor layer apart from each other; a third nitride semiconductor layer, between the source electrode and the drain electrode, containing a p-type first impurity and serving as a gate; and a fourth nitride semiconductor layer, between the third nitride semiconductor layer and the drain electrode, containing a p-type second impurity, wherein an average carrier concentration of the fourth nitride semiconductor layer is lower than an average carrier concentration of the third nitride semiconductor layer.

The semiconductor device according to the present disclosure can easily realize normally-OFF operation and can simultaneously realize a low ON resistance even without forming a recess part immediately under the third nitride semiconductor layer, which therefore permits realization of simple processes at low costs.

Moreover, presence of the fourth nitride semiconductor layer makes it possible to provide gentle electric field distribution at an end of the drain electrode and reduce current collapse. Further, the number of p-type carriers of the fourth nitride semiconductor layer is smaller than the number of p-type carriers of the third nitride semiconductor layer, thereby making it possible to reduce drain-source capacitance and drain-gate capacitance, permitting high-speed operation.

BRIEF DESCRIPTION OF DRAWINGS

These and other objects, advantages and features of the present disclosure will become apparent from the following description thereof taken in conjunction with the accompanying drawings that illustrate a specific embodiment of the present disclosure.

DETAILED DESCRIPTION OF THE EMBODIMENT

Hereinafter, a nitride semiconductor device according to an embodiment will be described in detail with reference to the drawings. Note that the embodiments described below illustrate one detailed example of the present disclosure. Numerical values, shapes, materials, components, arrangement positions of the components, connection modes, etc. form one example and are not intended to limit the present disclosure in any manner. Moreover, of the components in the embodiment below, those which are not described in an independent claim indicating an uppermost concept will be described as optional components.

EMBODIMENT

Figure 1:
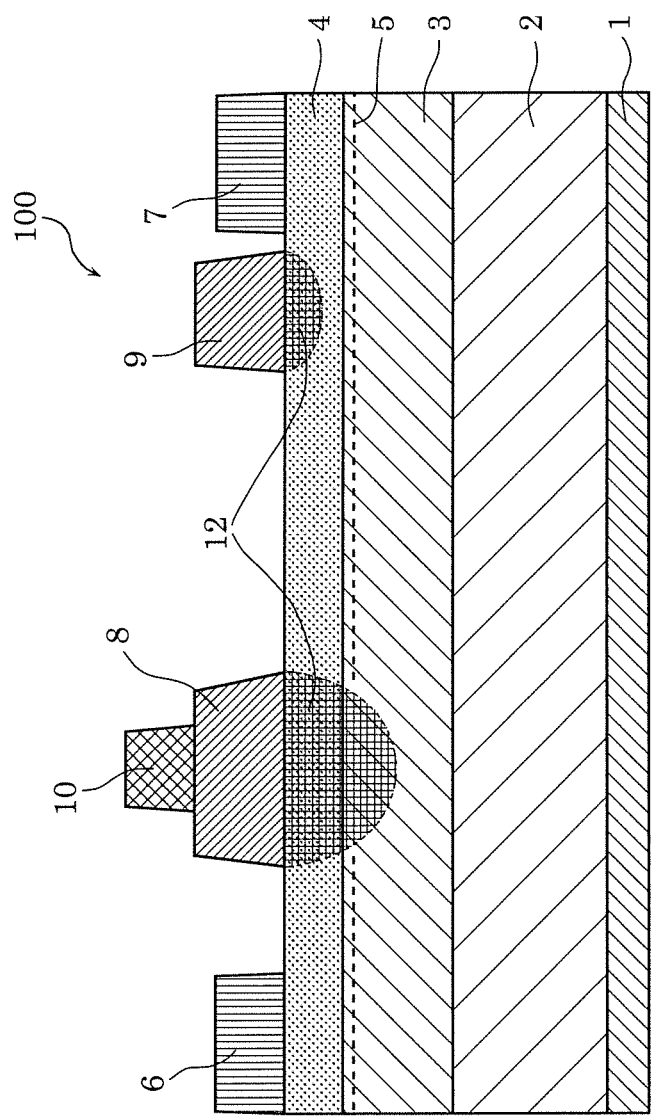
FIG. 1 is a sectional view illustrating a sectional structure of a nitride semiconductor device according to an embodiment.

FIG. 1 illustrates a sectional structure of the nitride semiconductor device according to the embodiment. Nitride semiconductor device 100 according to Embodiment 1 is characterized by having: third nitride semiconductor layer 8 containing a p-type first impurity and serving as a gate; and fourth nitride semiconductor layer 9, between a third nitride semiconductor layer 8 region and drain electrode 7, containing a p-type second impurity. The nitride semiconductor device according to the embodiment is also characterized in that the average carrier concentration of the fourth nitride semiconductor layer is lower than the average carrier concentration of the third nitride semiconductor layer.

Nitride semiconductor device 100 has, on appropriate Si substrate 1 (alternatively, for example, Sapphire, SiC, GaN, or AlN substrate), appropriate buffer layer 2 (for example, a signal layer or multiple layers of, for example, GaN, AlGaN, AlN, InGaN, or AlInGaN as a group-III nitride semiconductor), on which first nitride semiconductor layer 3 formed of GaN (alternatively, for example, InGaN, AlGaN, or AlInGaN as a group-III nitride semiconductor) is provided, on which second nitride semiconductor layer 4 formed of AlGaN (alternatively, for example, GaN, InGaN, AlGaN, AlN, or AlInGaN as a group-III nitride semiconductor) is provided.

Second nitride semiconductor layer 4 has a greater band gap than first nitride semiconductor layer 3, and in a case where second nitride semiconductor layer 4 is formed of AlGaN and first nitride semiconductor layer 3 is formed of GaN, a high concentration of two-dimensional electron gas (2 DEG) layer 5 is generated on a GaN layer side near an interface between AlGaN and GaN due to piezo charges generated from a lattice constant difference by AlGaN and GaN and due to a band gap difference.

Source electrode 6 and drain electrode 7 are on second nitride semiconductor layer 4 apart from each other. Source electrode 6 and drain electrode 7 are each formed of one or a combination of at least two of metals such as Ti, Al, Mo, and Hf which make ohmic contact with any of two-dimensional electron gas layer 5, second nitride semiconductor layer 4, and first nitride semiconductor layer 3. Source electrode 6 and drain electrode 7 are only required to be electrically connected to two-dimensional electron gas layer 5. For example, source electrode 6 and drain electrode 7 may be formed on a front surface of second nitride semiconductor layer 4 or may make contact with part of two-dimensional electron gas layer 5, second nitride semiconductor layer 4, and first nitride semiconductor layer 3 by use of a known ohmic recess technique (not illustrated).

Nitride semiconductor device 100 has, on second nitride semiconductor layer 4, third nitride semiconductor layer 8 and fourth nitride semiconductor layer 9. Third nitride semiconductor layer 8 and fourth nitride semiconductor layer 9 are apart from each other between source electrode 6 and drain electrode 7. Third nitride semiconductor layer 8 located closely to the source electrode is formed of p-GaN and contains the p-type first impurity (for example, Mg, Zn, or C). Third nitride semiconductor layer 8 may alternately be formed of, for example, p-InGaN, p-AlGaN, or p-AlInGaN as a group-III nitride semiconductor. Fourth nitride semiconductor layer 9 located closely to the drain electrode is formed of p-GaN and contains the p-type second impurity (Mg, Zn, or C). Fourth nitride semiconductor layer 9 may alternatively be formed of, for example, InGaN, AlGaN, or AlInGaN as a group-III nitride semiconductor containing a p-type impurity.

Gate electrode 10 is on third nitride semiconductor layer 8, providing third nitride semiconductor layer 8 as the gate. The average carrier concentration of fourth nitride semiconductor layer 9 is lower than the average carrier concentration of third nitride semiconductor layer 8. The average carrier concentration is obtained by dividing the number of carriers in third nitride semiconductor layer 8 or fourth nitride semiconductor layer 9 by a total volume. The carrier of third nitride semiconductor layer 8 may be a hole and a carrier of fourth nitride semiconductor layer 9 may be a hole or an electron (of an n-type in this case).

For example, in a case where third nitride semiconductor layer 8 is formed of p-GaN with the hole having the average carrier concentration of $1\times10^{17}$ cm$^{-3}$, fourth nitride semiconductor layer 9 is only required to have the average carrier concentration of $1\times10^{17}$ cm$^{-3}$ or less (of the hole or the electron). More specifically, as long as fourth nitride semiconductor layer 9 has the average carrier concentration of $1\times10^{17}$ cm$^{-3}$ or less, fourth nitride semiconductor layer 9 may be formed of p-GaN containing a low concentration of Mg, i-GaN (Insulated-GaN) containing C, or n-GaN.

A p-n junction is immediately under third nitride semiconductor layer 8, where depletion layer 12 for depleting two-dimensional electron gas layer 5 is formed, providing a normally-OFF state when no gate voltage is applied to gate electrode 10. However, since fourth nitride semiconductor layer 9 has the lower average carrier concentration and has small depletion layer 12 (or has no depletion layer 12 (not illustrated)), two-dimensional electron gas layer 5 remains immediately under fourth nitride semiconductor layer 9, turning an area immediately under fourth nitride semiconductor layer 9 into a normally-ON state (a state in which two-dimensional electron gas layer 5 is provided).

In a case where second nitride semiconductor layer 4 is formed of AlGaN, for the purpose of performing normally-OFF operation where Al composition is 20%, a film thickness of AlGaN needs to be within a range of 10 nm to 25 nm, desirably approximately 20 nm although depending on a threshold voltage (Vth) to be set. Moreover, in a case where third nitride semiconductor layer 8 is formed of p-GaN in the aforementioned condition, a film thickness may be within a range of 50 nm to 500 nm, desirably approximately 100 nm. In a case where the p-type first impurity is Mg, a doping concentration may be in a range of 1 cm$^{-3}$ to $10\times10^{19}$ cm$^{-3}$, desirably $5\times10^{19}$ cm$^{-3}$. Note that a carrier concentration of p-GaN obtained by doping Mg with approximately $5\times10^{19}$ cm$^{-3}$ is substantially around 1 cm$^{-3}$ to $5\times10^{17}$ cm$^{-3}$ since an Mg activation rate is as very low as several percentages or less.

Gate electrode 10 may be an electrode formed of one or a combination of at least two of metals such as Ti, Ni, Pd, Pt, Au, W, WSi, Ta, TiN, Al, Mo, Hf, and Zr. Gate electrode 10 may make ohmic contact or Schottky-contact with third nitride semiconductor layer 8 which contains the p-type first impurity, but making the ohmic contact provides higher gate performance. Thus, it is desirable to use an electrode formed of one or a combination of at least two of metals such as Ni, Pt, Pd, Au, Ti, Cr, In, and Sn as metals which have a low contact resistance.

Operation performed in nitride semiconductor device 100 will be described. In case of the normally-OFF operation, when the voltage applied to gate electrode 10 is 0V, two-dimensional electron gas layer 5 is not present since the depletion layer formed by the p-n junction extends immediately under third nitride semiconductor layer 8, resulting in an OFF state. Applying a positive gate voltage to fourth nitride semiconductor layer 9 with source electrode 6 grounded and with a positive voltage applied to drain electrode 7 reduces the depletion layer formed by the p-n junction immediately under third nitride semiconductor layer 8, and upon excess of the gate voltage over the threshold voltage (Vth), a current starts to flow between a source and a drain, resulting in an ON state. That is, the voltage applied to gate electrode 10 can control the current between the source and the drain.

Effects of nitride semiconductor device 100 will be described. Use of nitride semiconductor device 100 permits realization of the normally-OFF operation as well as realization of a high drain current and a low ON resistance even without forming a recess part immediately under third nitride semiconductor layer 8. Moreover, re-epitaxial growth is not required, thus permitting realization of easy processes at low costs. Further, presence of fourth nitride semiconductor layer 9 makes it possible to provide gentle electric field distribution at an end of the drain electrode and reduce current collapse. Furthermore, the number of p-type carriers of fourth nitride semiconductor layer 9 is smaller than the number of p-type carriers of third nitride semiconductor layer 8, which can reduce drain-source capacitance and drain-gate capacitance, permitting high-speed operation.

Variation 1

Next, a nitride semiconductor device according to Variation 1 of the embodiment will be described. The nitride semiconductor device according to Variation 1 of the embodiment is characterized in that a film thickness of fourth nitride semiconductor layer 9 is less than a film thickness of third nitride semiconductor layer 8.

Figure 2:
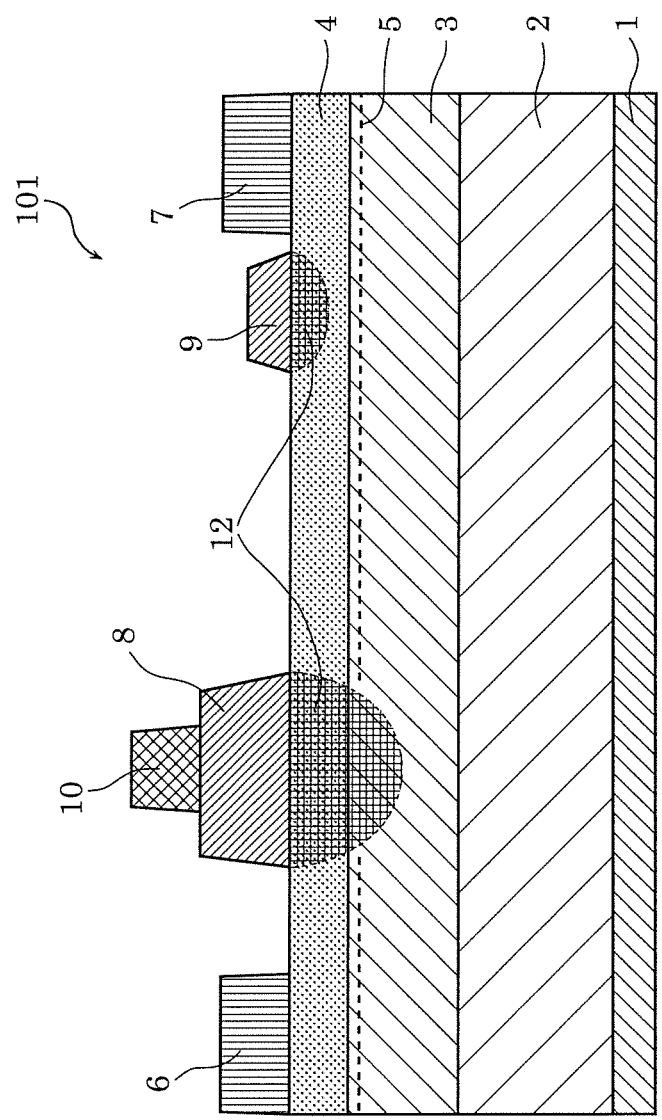
FIG. 2 is a sectional view illustrating a sectional structure of a nitride semiconductor device according to Variation 1 of the embodiment.

FIG. 2 illustrates a sectional structure of nitride semiconductor device 101 according to Variation 1 of the embodiment. The present variation will be described, referring to a group-III nitride semiconductor, but the present disclosure is not limited to the group-III nitride semiconductor. Moreover, the structure of FIG. 2 illustrates minimum configuration, although the present disclosure is not limited to the aforementioned minimum configuration.

Semiconductor laser element 101 differs from nitride semiconductor device 100 illustrated in FIG. 1 in a point that the film thickness of fourth nitride semiconductor layer 9 is less than the film thickness of third nitride semiconductor layer 8. Consequently, a depletion layer of a p-n junction located immediately under fourth nitride semiconductor layer 9 is small, providing a normally-OFF state immediately under fourth nitride semiconductor layer 9, so that the two-dimensional electron gas is not broken off and an ON-resistance is not sacrificed. Moreover, in nitride semiconductor device 101, there is not necessarily a difference in the average carrier concentration between third nitride semiconductor layer 8 and fourth nitride semiconductor layer 9. That is, third nitride semiconductor layer 8 and fourth nitride semiconductor layer 9 may have same p-type average carrier concentrations, or the average carrier concentration of fourth nitride semiconductor layer 9 may be lower than the average carrier concentration of third nitride semiconductor layer 8 as is the case with nitride semiconductor device 100.

Use of nitride semiconductor device 101 can provide same effects as the effects provided by nitride semiconductor device 100. Moreover, third nitride semiconductor layer 8 and fourth nitride semiconductor layer 9 in nitride semiconductor device 101 may have the same p-type average carrier concentration, and thus third nitride semiconductor layer 8 and fourth nitride semiconductor layer 9 do not have to be formed through different epitaxial growth processes. Thus, a process can more easily be realized at lower costs.

Variation 2

Next, a nitride semiconductor device according to Variation 2 of the embodiment will be described. The nitride semiconductor device according to Variation 2 of the embodiment is characterized in that high-resistance region 13 having a higher specific resistance than a specific resistance of fourth nitride semiconductor layer 9 is in fourth nitride semiconductor layer 9.

Figure 3:
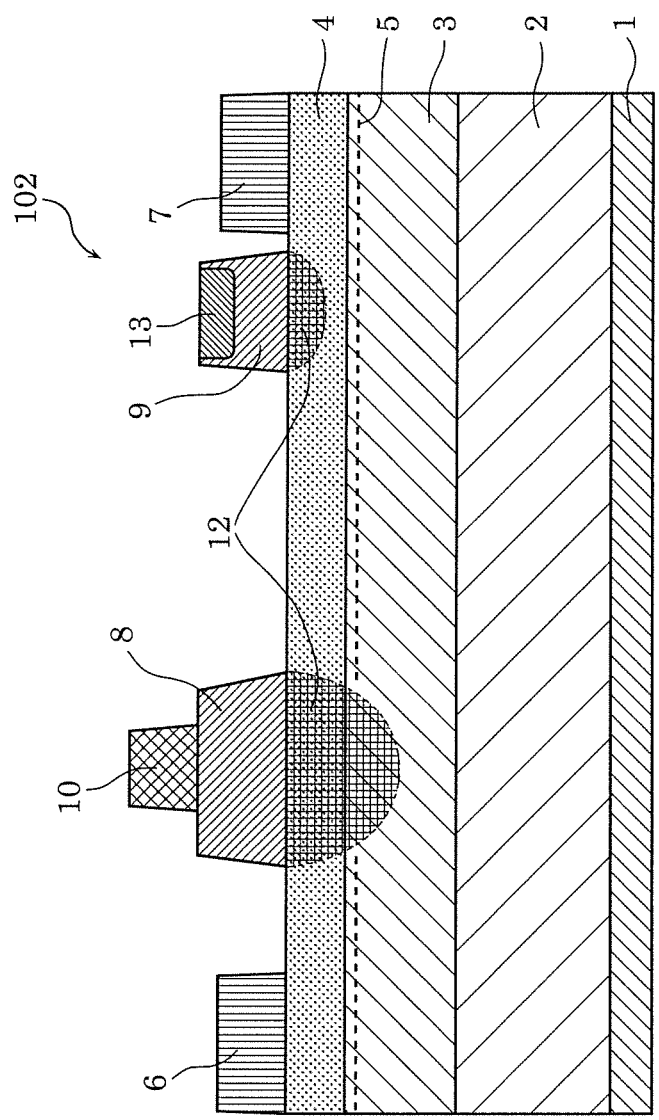
FIG. 3 is a sectional view illustrating a sectional structure of a nitride semiconductor device according to Variation 2 of the embodiment.

FIG. 3 illustrates a sectional structure of nitride semiconductor device 102 according to Variation 2 of the embodiment. The present variation will be described, referring to a group-III nitride semiconductor, but the present disclosure is not limited to the group-III nitride semiconductor. Moreover, the structure of FIG. 3 illustrates minimum configuration although the present disclosure is not limited to the aforementioned minimum configuration.

Nitride semiconductor device 102 differs from nitride semiconductor devices 100 and 101 illustrated in FIGS. 1 and 2 in a point that high-resistance region 13 is in fourth nitride semiconductor layer 9.

High-resistance region 13 can be formed by, for example, collectively subjecting third nitride semiconductor layer 8 and fourth nitride semiconductor layer 9 to epitaxial growth and then introducing, into fourth nitride semiconductor layer 9 region through ion implantation or plasma irradiation and independently from a p-type impurities such a third impurity that deactivates and provides a higher resistance to an-n-type or p-type nitride semiconductor. More specifically, it is desirable to use, for the third impurity, at least one of F, B, Ar, He, Fe, Cr, Zn, Ca, Ti, or H, more desirably, for example, F or Fe as an element which more deactivates and provides a higher resistance to the n-type or p-type nitride semiconductor.

However, to introduce the third impurity, for example, F through the plasma irradiation, for example, $CF_4$ or $SF_6$ is typically used as gas, but C and S are also introduced into fourth nitride semiconductor layer 9 region simultaneously with F. The implantation of the unintended elements into fourth nitride semiconductor layer 9 region can contribute to generation of a leak current. Moreover, plasma damage is caused in fourth nitride semiconductor layer 9 region as a result of the plasma irradiation, which similarly contributes to the generation of the leak current due to reasons, for example, an increased surface level or increased surface roughness. Thus, the plasma irradiation is not a desirable method for the formation of high-resistance region 13, and high-resistance region 13 needs to be formed through the ion implantation, if possible.

More deactivating and providing a higher resistance to high-resistance region 13 can be realized by increasing a concentration and a film thickness of the third impurity. More specifically, a peak concentration of the third impurity may be $1\times10^{18}$ cm$^{-3}$ or more, desirably $2\times10^{18}$ cm$^{-3}$ or more. Moreover, when an amount of the third impurity is converted into the average concentration of the third impurity contained in entire fourth nitride semiconductor layer 9 (an amount of the third impurity contained in a total volume of fourth nitride semiconductor layer 9 per unit volume), the concentration is desirably $1\times10^{17}$ cm$^{-3}$ or more. High-resistance region 13 may be located anywhere in fourth nitride semiconductor layer 9, for example, on a top surface of fourth nitride semiconductor layer 9 as illustrated in FIG. 3 or at a central part of fourth nitride semiconductor layer 9 (not illustrated), or may be dispersed in fourth nitride semiconductor layer 9 in a patchy fashion (not illustrated).

Moreover, to reduce a volume of a p-type region of fourth nitride semiconductor layer 9 and reduce the average carrier concentration of fourth nitride semiconductor layer 9, a total thickness of high-resistance region 13 containing the third impurity may be 20 nm or more, desirably 70 nm or more. Note that the film thickness of high-resistance region 13 is defined as a film thickness which contains at least $1\times10^{17}$ cm$^{-3}$ of the third impurity. To more deactivate and provide a higher resistance to high-resistance region 13, it is desirable to satisfy both conditions that the thickness of high-resistance region 13 is 20 nm or more and that the peak concentration of the third impurity is $2\times10^{18}$ cm$^{-3}$ or more.

Moreover, high-resistance region 13 containing the third impurity may reach, through fourth nitride semiconductor layer 9, second nitride semiconductor layer 4 located immediately under fourth nitride semiconductor layer 9. However, reaching even first nitride semiconductor layer 3 which is formed with two-dimensional electron gas layer 5 and which operates as a channel reduces two-dimensional electron gas layer 5 located immediately under a gate upon ON-operation and undesirably increases an ON-resistance. Thus, it is important that the third impurity do not go beyond a bottom part of second nitride semiconductor layer 4, desirably, be located at least 10 nm above the bottom part of second nitride semiconductor layer 4 in view of process variation.

Providing high-resistance region 13 results in a relative decrease in the volume of the p-type region of fourth nitride semiconductor layer 9 and reduces a depletion layer of a p-n junction located immediately under fourth nitride semiconductor layer 9, so that secondary electron gas is immediately under fourth nitride semiconductor layer 9 and the ON-resistance is not sacrificed. Further, the number of p-type carriers of fourth nitride semiconductor layer 9 decreases as a result of providing high-resistance region 13, which can therefore also reduce the drain-source capacitance and the drain-gate capacitance, permitting high-speed operation.

Use of nitride semiconductor device 102 can provide same effects as the effects provided by nitride semiconductor devices 100 and 101 illustrated in FIGS. 1 and 2. Moreover, third nitride semiconductor layer 8 and fourth nitride semiconductor layer 9 do not have to be formed through mutually different epitaxial growth processes in nitride semiconductor device 102, which permits realization of an even easier process at lower costs.

Variation 3

Next, a nitride semiconductor device according to Variation 3 of the embodiment will be described. The nitride semiconductor device according to Variation 3 of the embodiment is characterized in that second drain electrode 11 electrically connected to drain electrode 7 is on fourth nitride semiconductor layer 9.

Figure 4:
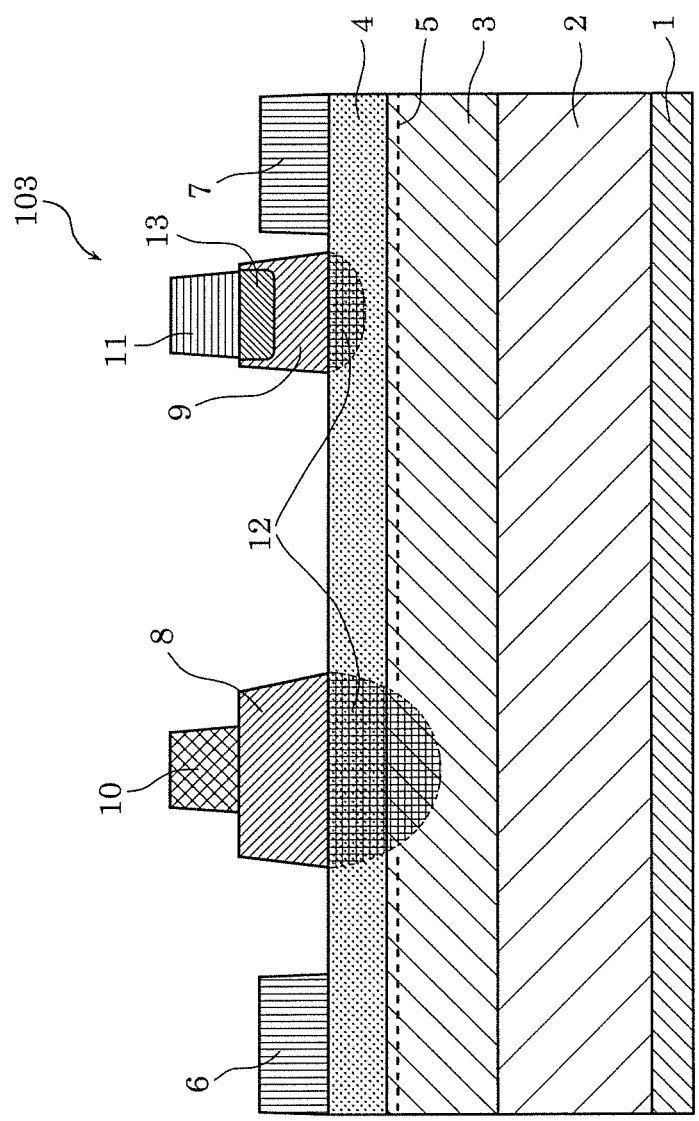
FIG. 4 is a sectional view illustrating a sectional structure of a nitride semiconductor device according to Variation 3 of the embodiment.

FIG. 4 illustrates a sectional structure of nitride semiconductor device 103 according to Variation 3 of the embodiment. The present variation will be described, referring to a group-III nitride semiconductor but the present disclosure is not limited to the group-III nitride semiconductor. Moreover, the structure of FIG. 4 illustrates minimum configuration although the present disclosure is not limited to the aforementioned minimum structure.

Nitride semiconductor device 103 differs from nitride semiconductor devices 100, 101, and 102 illustrated in FIGS. 1 to 3 in a point that second drain electrode 11 electrically connected to drain electrode 7 is on fourth nitride semiconductor layer 9. Drain electrode 7 and second drain electrode 11 are connected to each other with, for example, a wiring conductor (not illustrated) in between. Drain electrode 7 and second drain electrode 11 may have substantially same potential.

Second drain electrode 11 may make ohmic contact or Schottky-contact with fourth nitride semiconductor layer 9, and thus may be an electrode formed of one or a combination of at least two of metals such as Ti, Ni, Pd, Pt, Au, W, WSi, Ta, TiN, Al, Mo, Hf, and Zr.

Use of nitride semiconductor device 103 can provide same effects as the effects provided by nitride semiconductor devices 100, 101, and 102 illustrated in FIGS. 1 to 3. Moreover, as a result of the electrical connection of second drain electrode 11 to drain electrode 7, upon application of a positive voltage of several volts or more to drain electrode 7, the positive voltage is also similarly applied to second drain electrode 11, whereby a hole is implanted in a crystal from fourth nitride semiconductor layer 9 in a case where fourth nitride semiconductor layer 9 is of a p-type, which can cancel electrons trapped to, for example, a defect or a surface level in the crystal contributing to current collapse. Consequently, it is possible to remarkably suppress the current collapse. Moreover, a carrier concentration in fourth nitride semiconductor layer 9 can be reduced in nitride semiconductor device 103, thus permitting a reduction in a leak current between a drain and a substrate.

Variation 4

Next, a nitride semiconductor device according to Variation 4 of the embodiment will be described. The nitride semiconductor device according to Variation 4 of the embodiment is characterized in that drain electrode 7 covers a top part of fourth nitride semiconductor layer 9.

Figure 5:
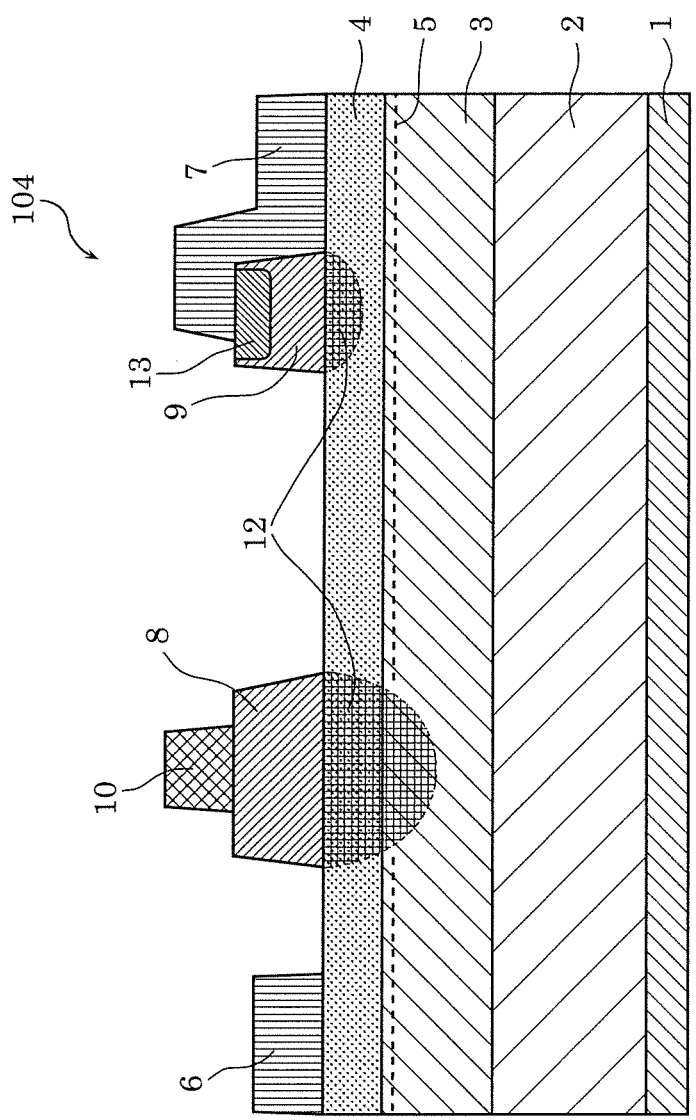
FIG. 5 is a sectional view illustrating a sectional structure of a nitride semiconductor device according to Variation 4 of the embodiment.

FIG. 5 illustrates a sectional structure of nitride semiconductor device 104 according to Variation 4 of the embodiment. The present variation will be described, referring to a group-III nitride semiconductor but the present disclosure is not limited to the group-III nitride semiconductor. Moreover, the structure of FIG. 5 illustrates minimum configuration although the present disclosure is not limited to the aforementioned minimum configuration.

Nitride semiconductor device 104 differs from nitride semiconductor device 103 illustrated in FIG. 4 in a point that drain electrode 7 covers the top part of fourth nitride semiconductor layer 9. Nitride semiconductor device 104 has a structure such that second drain electrode 11 illustrated in nitride semiconductor device 103 is integrated with drain electrode 7. Drain electrode 7 makes ohmic contact with any of two-dimensional electron gas layer 5, second nitride semiconductor layer 4, and first nitride semiconductor layer 3 and also simultaneously makes contact with fourth nitride semiconductor layer 9. Thus, drain electrode 7 in nitride semiconductor device 104 needs to be an electrode formed of one or a combination of at least two of metals such as Ti, Al, Mo, and Hf which make ohmic contact with any of two-dimensional electron gas layer 5, second nitride semiconductor layer 4, and first nitride semiconductor layer 3.

Use of nitride semiconductor device 104 can provide same effects as the effects provided by nitride semiconductor devices 100, 101, 102, and 103 illustrated in FIGS. 1 to 4. Moreover, as is the case with nitride semiconductor device 103 illustrated in FIG. 4, as a result of application of a positive voltage to drain electrode 7, in a case where fourth nitride semiconductor layer 9 is of a p-type, a hole is implanted into a crystal from fourth nitride semiconductor layer 9, which can cancel electrons trapped to, for example, a defect or a surface level in a crystal contributing to current collapse. Consequently, it is possible to remarkably suppress the current collapse. Moreover, compared to nitride semiconductor device 103 illustrated in FIG. 4, second drain electrode 11 does not have to be formed independently from drain electrode 7, which therefore permits realization of an even easier process at lower costs.

Variation 5

Next, a nitride semiconductor device according to Variation 5 of the embodiment will be described. The nitride semiconductor device according to Variation 5 of the embodiment is characterized in that drain electrode 7 (also including second drain electrode 11 connected to drain electrode 7) is in contact with both fourth nitride semiconductor layer 9 and high-resistance region 13.

Figure 6:
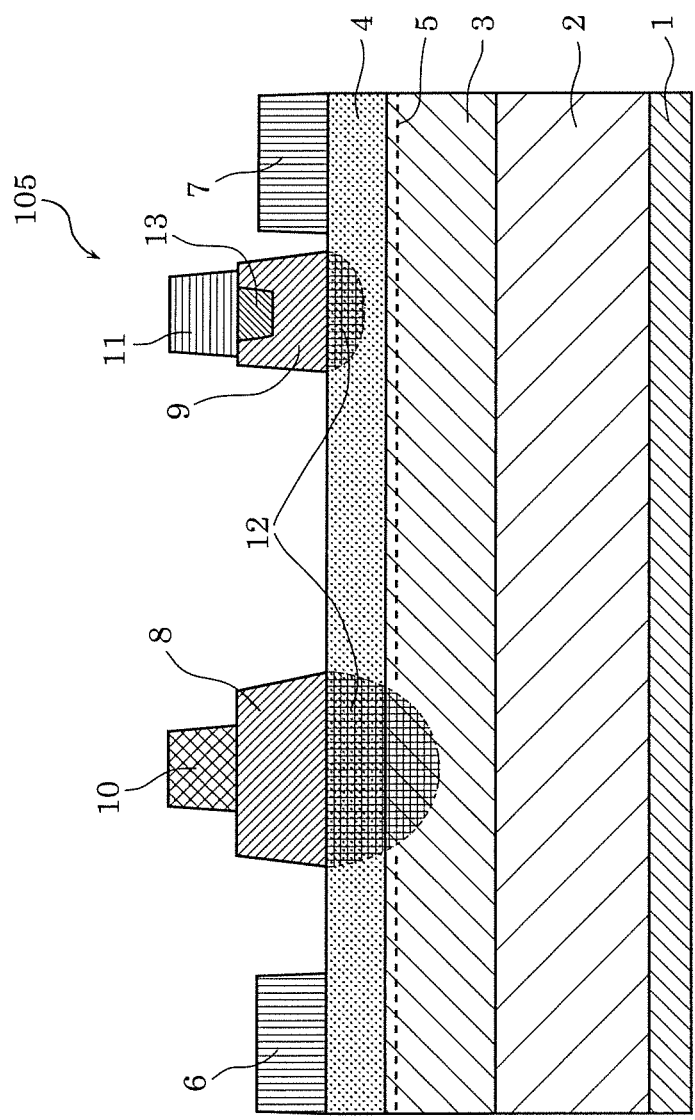
FIG. 6 is a sectional view illustrating a sectional structure of a nitride semiconductor device according to Variation 5 of the embodiment.

FIG. 6 illustrates a sectional structure of nitride semiconductor device 105 according to Variation 5 of the embodiment. The present variation will be described, referring to a group-III nitride semiconductor but the present disclosure is not limited to the group-III nitride semiconductor. Moreover, the structure of FIG. 6 illustrates minimum configuration, although the present disclosure is not limited to the aforementioned minimum configuration.

Nitride semiconductor device 105 differs from nitride semiconductor device 103 illustrated in FIG. 4 in a point that second drain electrode 11 is in contact with both fourth nitride semiconductor layer 9 and high-resistance region 13. The nitride semiconductor device according to the present variation is not limited to nitride semiconductor device 105, and as is the case with nitride semiconductor device 104 illustrated in FIG. 5, the nitride semiconductor device according to the present variation may have a structure such that second drain electrode 11 is integrated with drain electrode 7 and drain electrode 7 is in contact with both fourth nitride semiconductor layer 9 and high-resistance region 13. Note that a place where high-resistance region 13 is located is not limited to a top surface of fourth nitride semiconductor layer 9 and may also be on a side surface of fourth nitride semiconductor layer 9.

Use of nitride semiconductor devices 104 and 105 can provide same effects as the effects provided by nitride semiconductor device 103 illustrated in FIG. 4. Moreover, in a case where fourth nitride semiconductor layer 9 is of a p-type, the direct contact of second drain electrode 11 or drain electrode 7 with fourth nitride semiconductor layer 9 more directly prompts hole implantation from fourth nitride semiconductor layer 9, which can cancel out electrons trapped to, for example, a defect or surface level in a crystal contributing to current collapse. Consequently, it is possible to suppress the current collapse.

Simultaneously, second drain electrode 11 or drain electrode 7 in nitride semiconductor devices 104 and 105 is also in contact with high-resistance region 13, and thus compared to a structure such that no high-resistance region 13 is in fourth nitride semiconductor layer 9, a carrier concentration in fourth nitride semiconductor layer 9 can be more reduced, permitting a reduction in a leak current between a drain and a substrate. Moreover, a further relative reduction in the number of p-type carriers in fourth nitride semiconductor layer 9 can also reduce drain-source capacitance and drain-gate capacitance, permitting high-speed operation.

Variation 6 Next, a nitride semiconductor device according to Variation 6 of the embodiment will be described. The nitride semiconductor device according to Variation 6 of the embodiment is characterized in that, of fourth nitride semiconductor layer 9 and high-resistance region 13, only high-resistance region 13 is in contact with drain electrode 7 (including second drain electrode 11 connected to drain electrode 7).

Figure 7:
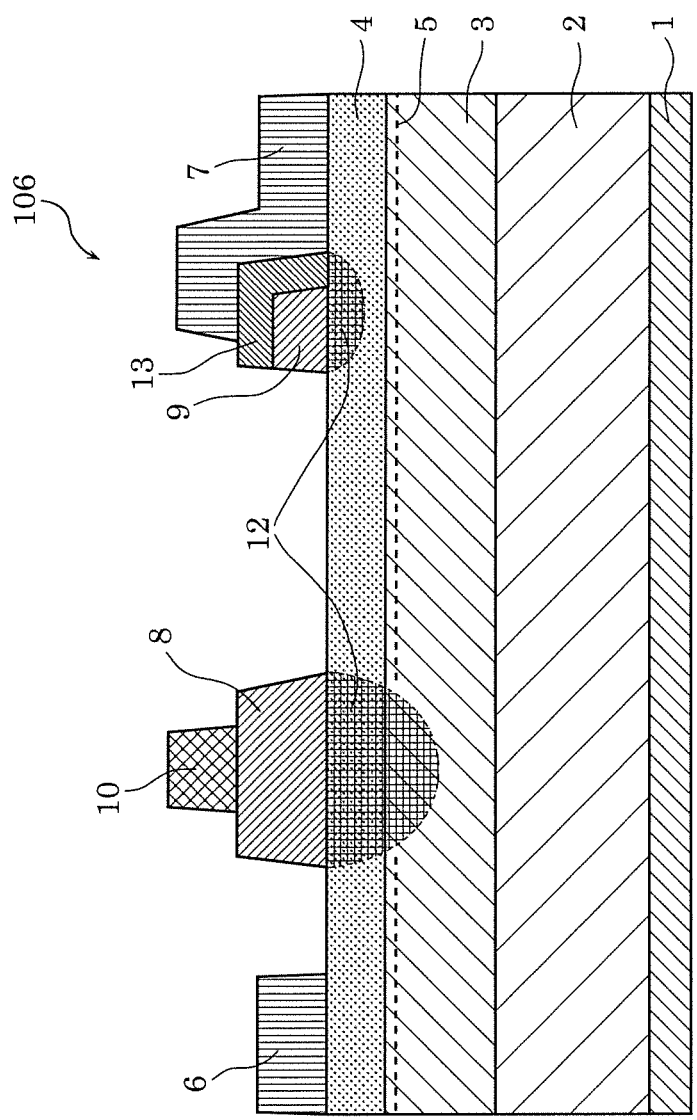
FIG. 7 is a sectional view illustrating a sectional structure of a nitride semiconductor device according to Variation 6 of the embodiment.

FIG. 7 illustrates a sectional structure of nitride semiconductor device 106 according to Variation 6 of the embodiment. The present variation will be described, referring to a group-III nitride semiconductor but the present disclosure is not limited to the group-III nitride semiconductor. Moreover, the structure of FIG. 7 illustrates minimum configuration, although the present disclosure is not limited to the aforementioned minimum configuration.

Nitride semiconductor device 106 differs from nitride semiconductor device 104 illustrated in FIG. 5 in a point that, of fourth nitride semiconductor layer 9 and high-resistance region 13, only high-resistance region 13 is in contact with drain electrode 7. The nitride semiconductor device according to the present variation is not limited to nitride semiconductor device 106, and as is the case with nitride semiconductor device 103 illustrated in FIG. 4, may have a structure such that second drain electrode 11 electrically connected to drain electrode 7 is on fourth nitride semiconductor layer 9 and, of fourth nitride semiconductor layer 9 and high-resistance region 13, only high-resistance region 13 is in contact with second drain electrode 11. That is, both drain electrode 7 and second drain electrode 11 electrically connected to drain electrode 7 in the nitride semiconductor device according to the present variation are not in contact with fourth nitride semiconductor layer 9. Note that a place where high-resistance region 13 is located is not limited to a top surface of fourth nitride semiconductor layer 9 and may be on a side surface of fourth nitride semiconductor layer 9.

Use of nitride semiconductor devices 103 and 106 can provide same effects as the effects provided by nitride semiconductor devices 104 and 105 illustrated in FIGS. 5 and 6. Moreover, of fourth nitride semiconductor layer 9 and high-resistance region 13, only high-resistance region 13 is in direct contact with drain electrode 7 and second drain electrode 11 electrically connected to drain electrode 7, thereby increasing an electrical resistance between drain electrode 7 and fourth nitride semiconductor layer 9, which can remarkably reduce a leak current between a drain and a substrate. Further, it is possible to more reduce drain-source capacitance and drain-gate capacitance, permitting high-speed operation.

Variation 7

Next, a nitride semiconductor device according to Variation 7 of the embodiment will be described. The nitride semiconductor device according to Variation 7 of the embodiment is characterized in that a recess part is provided at a portion of second nitride semiconductor layer 4 located under third nitride semiconductor layer 8.

Figure 8:
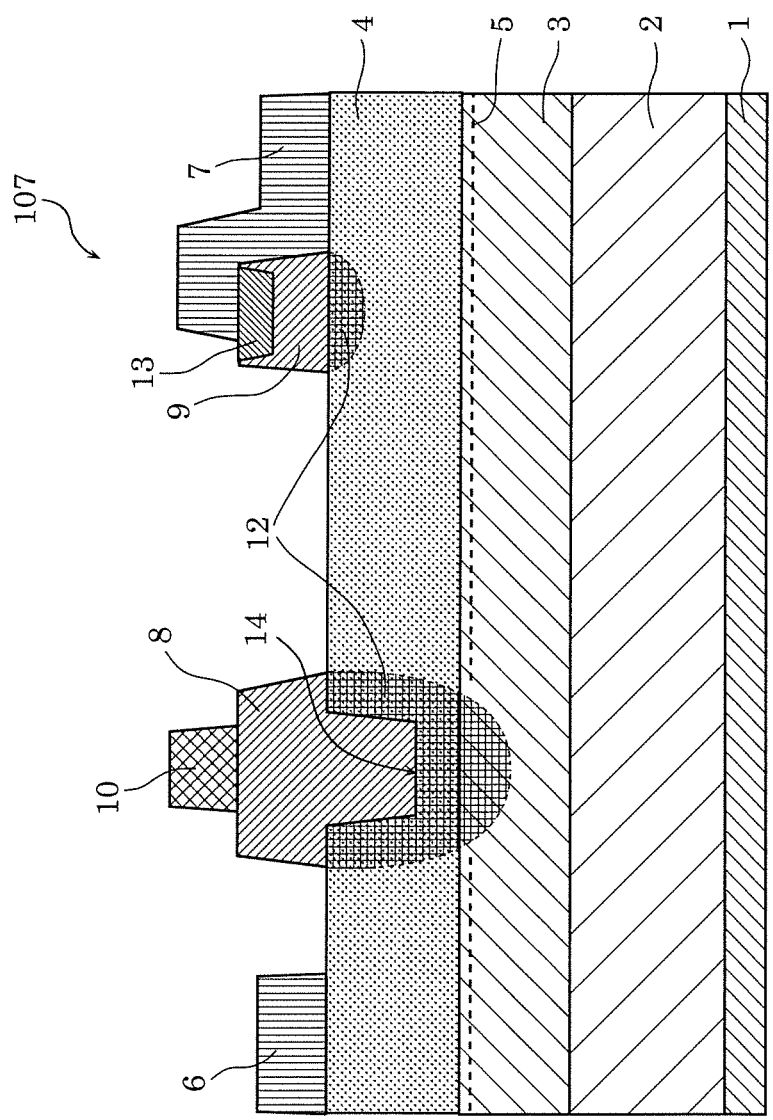
FIG. 8 is a sectional view illustrating a sectional structure of a nitride semiconductor device according to Variation 7 of the embodiment.
Figure 9:
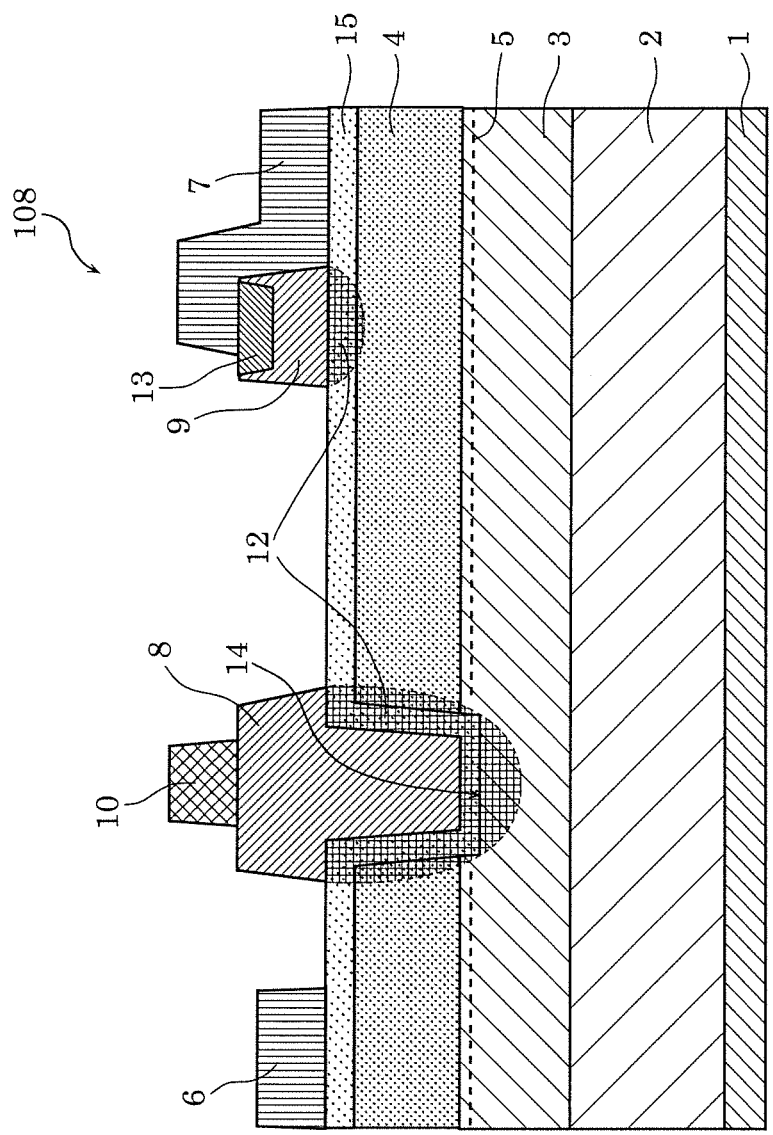
FIG. 9 is a sectional view illustrating a sectional structure of a nitride semiconductor device according to Variation 7 of the embodiment.

FIGS. 8 and 9 illustrate sectional structures of nitride semiconductor devices 107 and 108 each of which has the recess part at the portion of second nitride semiconductor layer 4 located under third nitride semiconductor layer 8 according to Variation 7 of the embodiment. Moreover, the present disclosure will be described, referring to a group-III nitride semiconductor, although the present disclosure is not limited to the group-III nitride semiconductor. FIGS. 8 and 9 also illustrate minimum configuration, although the present disclosure is not limited to the aforementioned minimum configuration.

Nitride semiconductor devices 107 and 108 differ from nitride semiconductor devices 100 to 106 illustrated in FIGS. 1 to 7 in a point that recess part 14 is provided at second nitride semiconductor layer 4 under third nitride semiconductor layer 8. Note that recess part 14 may be terminated in middle of second nitride semiconductor layer 4 as illustrated in FIG. 8 or may reach first nitride semiconductor layer 3 through second nitride semiconductor layer 4 and second nitride semiconductor layer 4 may be connected again by regrowth layer 15 as illustrated in FIG. 9. In such a case, as is the case with second nitride semiconductor layer 4, regrowth layer 15 may be formed of AlGaN (alternatively, for example, GaN, InGaN, AlGaN, or AlInGaN as a group-III nitride semiconductor) and regrowth layer 15 has a greater band gap than first nitride semiconductor layer 3.

A remaining film thickness of second nitride semiconductor layer 4 located immediately under recess part 14 of FIG. 8 or a film thickness of regrowth layer 15 located immediately above recess part 14 of FIG. 9 is correlated with a threshold voltage of the semiconductor device. For the purpose of performing normally-OFF operation, an AlGaN film thickness needs to be within a range of 10 nm to 25 nm, desirably approximately 20 nm where Al composition is 20% although depending on a threshold voltage (Vth) to be set.

Comparted to nitride semiconductor devices 100 to 106 illustrated in FIGS. 1 to 7, use of nitride semiconductor devices 107 and 108 results in higher manufacturing costs since a regrowth process is included but makes it possible to make second nitride semiconductor layer 4 thick regardless of the threshold voltage. Moreover, Al composition of second nitride semiconductor layer 4 can be increased, thus permitting an increase in a carrier concentration of two-dimensional electron gas layer 5. Consequently, an ON resistance can be reduced and a maximum drain current can be increased. Moreover, two-dimensional electron gas layer 5 can physically be separated from a front surface of second nitride semiconductor layer 4 excluding recess part 14, which can remove an influence of electrons trapped at a surface level of the front surface of second nitride semiconductor layer 4 and can remarkably reduce current collapse.

Manufacturing Method

Next, a method for manufacturing the nitride semiconductor device according to the embodiment will be described.

Figure 10:
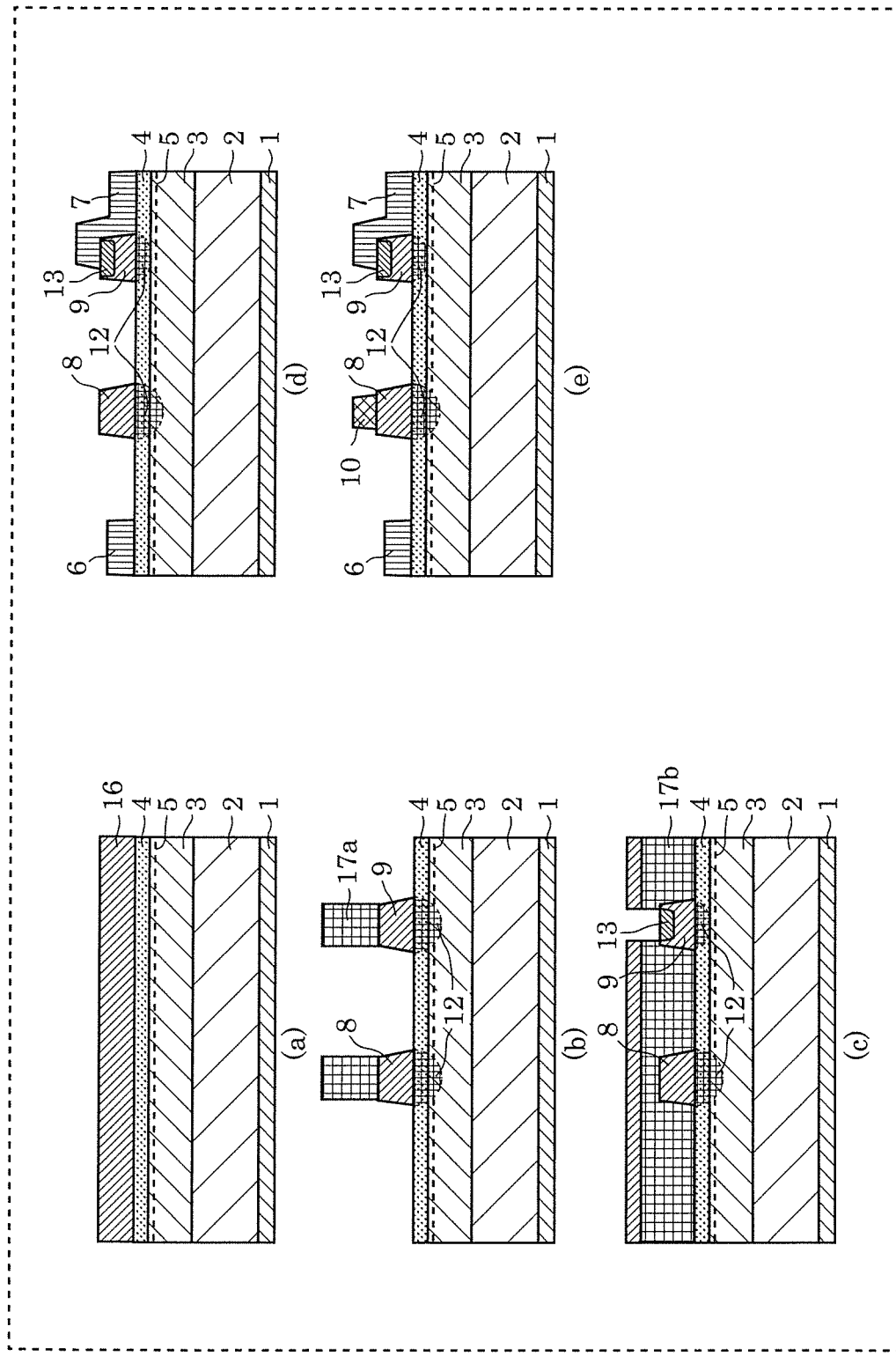
FIG. 10 is a process chart illustrating a method for manufacturing the nitride semiconductor device according to the embodiment.

Illustrated in (a) to (e) in FIG. 10 is a flow diagram illustrating a method for manufacturing nitride semiconductor device 104 illustrated in FIG. 5. Note that FIG. 10 illustrates minimum configuration, although the present disclosure is not limited to the aforementioned minimum configuration. Moreover, the present disclosure is not limited to a sequence of the present manufacturing method.

First, appropriate buffer layer 2 (for example, a single layer or multiple layers of, for example, GaN, AlGaN, AlN, InGaN, or AlInGaN as a group-III nitride semiconductor) is formed on Si substrate 1 (alternatively, for example, a substrate of, for example, Sapphire, SiC, GaN, or AlN) on appropriate surface (111) by use of an epitaxial growth technique such as a known MOCVD method, on which first nitride semiconductor layer 3 formed of GaN (alternatively, for example, InGaN, AlGaN, or AlInGaN as a group-III nitride semiconductor) is formed, on which second nitride semiconductor layer 4 formed of AlGaN (alternatively, for example, GaN, InGaN, or AlInGaN as a group-III nitride semiconductor) having a greater band gap than first nitride semiconductor layer 3 is formed, on which fifth nitride semiconductor layer 16 formed of p-GaN and containing a p-type impurity (for example, Mg, Zn, or C) (alternatively, for example, p-InGaN, p-AlGaN, or p-AlInGaN as a group-III nitride semiconductor) is continuously formed ((a) in FIG. 10).

In a case where second nitride semiconductor layer 4 is formed of AlGaN, to perform the normally-OFF operation, an AlGaN film thickness needs to be within a range of 10 nm to 25 nm, desirably approximately 20 nm where AL composition is 20% although depending on the set threshold voltage (Vth). Moreover, in a case where fifth nitride semiconductor layer 16 is formed of p-GaN in the aforementioned condition, a film thickness is only required to be in a range of 50 nm to 500 nm, desirably approximately 100 nm, and in a case where the p-type first impurity is Mg, a doping concentration is only required to be in a range of $1$ $cm^{-3}$ to $10 \times 10^{19}$ $cm^{-3}$, desirably $5 \times 10^{19}$ $cm^{-3}$. Note that the carrier concentration of p-GaN with which Mg is doped with approximately $5 \times 10^{19}$ $cm^{-3}$ is substantially around $1$ $cm^{-3}$ to $5 \times 10^{17}$ $cm^{-3}$ since an Mg activation rate is equal to or less than several percentages which is very low.

Next, resist pattern 17a is formed by use of a known photolithography technique, and fifth nitride semiconductor layer 16 formed of p-GaN and containing the p-type impurity (for example, Mg, Zn, or C) is selectively removed by use of a known dry etching technique. Consequently, third nitride semiconductor layer 8 which is formed of p-GaN, which contains the p-type first impurity (for example, Mg, Zn, or C), and which is located closely to the source electrode and fourth nitride semiconductor layer 9 which is formed of p-GaN, which contains the p-type second impurity (for example, Mg, Zn, or C), and which is located closely to the drain electrode are formed apart from each other ((b) in FIG. 10).

Note that, with the present manufacturing method, the p-type first impurity contained in third nitride semiconductor layer 8 and the p-type second impurity contained in fourth nitride semiconductor layer 9 originate from fifth nitride semiconductor layer 16 made through the preceding process. Thus, the same impurities are provided with same impurity concentrations but the impurities and the impurity concentrations do not necessarily have to be the same. In such a case, third nitride semiconductor layer 8 and fourth nitride semiconductor layer 9 may be formed independently from each other through, for example, selected regrowth.

Subsequently, to activate Mg as the p-type impurity of third nitride semiconductor layer 8 and fourth nitride semiconductor layer 9, activation annealing is carried out for approximately 30 minutes at a temperature of 800° C. in nitrogen gas (not illustrated). Through the activation annealing, bonding with hydrogen deactivating Mg as a p-type element is broken, improving the Mg activation rate, and third nitride semiconductor layer 8 and fourth nitride semiconductor layer 9 containing the p-type impurities form depletion layer 10 through the p-n junction, depleting two-dimensional electron gas layer 5 located immediately thereunder. Consequently, the threshold voltage of third nitride semiconductor layer 8 operating as the gate of a transistor turns to be positive, resulting in normally-OFF operation.

Subsequently, resist pattern 17b having an opening part is formed on the top surface of fourth nitride semiconductor layer 9 again by use of a known photolithography technique. The third impurity is introduced into fourth nitride semiconductor layer 9 through the opening part of resist pattern 17b by a known ion implantation technique or plasma irradiation technique, forming high-resistance region 13 having a higher specific resistance than a specific resistance of the fourth nitride semiconductor layer ((c) in FIG. 10).

The third impurity contained in high-resistance region 13 is desirably an element which is, for the purpose of deactivating and providing a higher resistance to high-resistance region 13, at least one of F, B, Ar, He, Fe, Cr, Zn, Ca, or Ti, desirably, for example, F or Fe and which completely deactivates and provides a higher resistance to an n-type or p-type nitride semiconductor.

Note that, however, upon the introduction of the third impurity, for example, G through the plasma irradiation, for example, $CF_4$ or $SF_6$ is typically used as gas, but C and S are also introduced into fourth nitride semiconductor layer 9 region simultaneously with F. Implantation of the aforementioned unintended elements into fourth nitride semiconductor layer 9 region can contribute to leak current generation. Moreover, plasma damage occurs in fourth nitride semiconductor layer 9 region through the plasma irradiation, similarly contributing to the leak current generation due to reasons, for example, an increased surface level and increased surface roughness. Thus, the plasma irradiation is not a desirable method for forming high-resistance region 13, and high-resistance region 13 needs to be formed through the ion implantation if possible.

Moreover, to deactivate and provide a higher resistance to high-resistance region 13, a peak concentration of the third impurity is $1 \times 10^{18}$ $cm^{-3}$ or more, desirably $2 \times 10^{18}$ $cm^{-3}$ or more. Moreover, when the amount of the aforementioned third impurity is converted into the average concentration of the third impurity contained in entire fourth nitride semiconductor layer 9 (the amount of the third impurity contained in the total volume of fourth nitride semiconductor layer 9 per unit volume), the peak concentration of the third impurity is desirably $1 \times 10^{17}$ $cm^{-3}$ or more. In a case where F is used as the third impurity, the ion implantation is achieved by selecting $F^+$ or $BF_2^+$ from, for example, $BF_3$ gas. Acceleration energy of the ion implantation is within a range of 10 keV to 100 keV, desirably approximately 40 keV and a required dose amount is $1 \times 10^{13}$ $cm^{-2}$ or more, desirably approximately $5 \times 10^{13}$ $cm^{-2}$.

An implantation depth may reach second nitride semiconductor layer 4 through fourth nitride semiconductor layer 9, but reaching even first nitride semiconductor layer 3 which is formed with two-dimensional electron gas layer 5 and which operates as the channel reduces two-dimensional electron gas layer 5 located immediately under the gate upon ON operation and undesirably increases the ON resistance. Thus, it is important that the implantation depth of the third impurity does not go beyond the bottom part of second nitride semiconductor layer 4, desirably the depth stops at least 10 nm above the bottom part of second nitride semiconductor layer 4 in view of the process variation.

Moreover, for the purpose of providing the higher resistance through the ion implantation, the opening part of resist pattern 17b needs to be located on an inner side of an upper surface end of fourth nitride semiconductor layer 9 selectively formed. In a case where the opening part of projection 17 is located outside of the upper surface end, the ion implantation provides a higher resistance to first nitride semiconductor layer 3 and second nitride semiconductor layer 4, which remarkably deteriorates the ON resistance of the device, so that the device no longer operates as an FET.

Note that in a case where high-resistance region 13 is formed through a known ion implantation technique before third nitride semiconductor layer 8 and fourth nitride semiconductor layer 9 separating fifth nitride semiconductor layer 16 through the selected dry etching technique are formed as illustrated in (b) in FIG. 10, high-resistance region 13 may be provided all across the top surface of fourth nitride semiconductor layer 9 (not illustrated).

Subsequently, resist pattern 17 is removed by use of, for example, a known oxygen ashing technique or an organic resist removal technique, and source electrode 6 and drain electrode 7 are formed by use of, for example, a known photolithography technique, a deposition technique, a lift-off technique, a sputtering technique, or a dry etching technique ((d) in FIG. 10).

Source electrode 6 and drain electrode 7 are each formed of one or a combination of at least two of metals such as Ti, Al, Mo, and Hf which make ohmic contact with any of two-dimensional electron gas layer 5, second nitride semiconductor layer 4, and first nitride semiconductor layer 3, and source electrode 6 and drain electrode 7 are only required to be electrically connected to two-dimensional electron gas layer 5. For example, source electrode 6 and drain electrode 7 may be formed on a front surface of second nitride semiconductor layer 4, and are only required to be in contact with part of two-dimensional electron gas layer 5, second nitride semiconductor layer 4, and first nitride semiconductor layer 3 by use of a known ohmic technique (not illustrated). Source electrode 6 and drain electrode 7 may be subjected to annealing to reduce a contact resistance.

Moreover, drain electrode 7 may cover even a top of fourth nitride semiconductor layer 9, and as illustrated in FIGS. 4 and 6, second drain electrode 11 may be formed apart through the same process by use of the resist pattern or may be formed through a different process.

Finally, depletion layer 10 is formed by use of, for example, a known photolithographic technique, a deposition technique, a lift-off technique, a sputtering technique, or a dry etching technique ((e) in FIG. 10).

High-resistance region 13 may be provided anywhere as long as high-resistance region 13 is located in fourth nitride semiconductor layer 9 containing the p-type impurity, and thus high-resistance region 13 may be, for example, on an outermost surface or at a central part of fourth nitride semiconductor layer 9 or may be provided (dispersed) in fourth nitride semiconductor layer 9 in a patchy fashion. However, to suppress the leak current between the drain and the substrate, high-resistance region 13 is desirably on the outermost surface of fourth nitride semiconductor layer 9 and makes most possible contact with drain electrode 7 (or second drain electrode 11 if any).

Gate electrode 10 may be an electrode formed of one or a combination of at least two of the metals such as Ti, Ni, Pd, Pt, Au, W, WSi, Ta, TiN, Al, Mo, Hf, and Zr. However, using, for gate electrode 10, the metal which contains the p-type first impurity and which makes Schottky contact with third nitride semiconductor layer 8 causes a gate reliability problem, for example, gate breakdown upon application of a gate voltage of 6V or more with high possibility. Thus, to ensure reliability of the gate, it is desirable to use an electrode formed of one or a combination of at least two of metals such as Ni, Pt, Pd, Au, Ti, Cr, In, and Sn as metals which make ohmic contact with third nitride semiconductor layer 8 or which have a low contact resistance.

Note that second drain electrode 11 as illustrated in FIGS. 4 and 6 may simultaneously be formed through the same process of forming third nitride semiconductor layer 8 by use of the resist pattern. In such a case, second drain electrode 11 is an electrode formed of one or a combination of at least two of metals such as Ti, Ni, Pd, Pt, Au, W, WSi, Ta, TiN, Al, Mo, Hf, and Zr, which is the case with gate electrode 10.

Although only an exemplary embodiment of the present disclosure has been described in detail above, those skilled in the art will readily appreciate that many modifications are possible in the exemplary embodiment without materially departing from the novel teachings and advantages of the present disclosure. Accordingly, all such modifications are intended to be included within the scope of the present disclosure.

INDUSTRIAL APPLICABILITY

The present disclosure can provide, at low costs, a semiconductor device capable of realizing normally-OFF operation and thereby improve performance of a power device.

What is claimed is:

1. A nitride semiconductor device, comprising:
a substrate;
a first nitride semiconductor layer on the substrate;
a second nitride semiconductor layer on the first nitride semiconductor layer, the second nitride semiconductor layer having a greater band gap than the first nitride semiconductor layer;
a source electrode and a drain electrode on the second nitride semiconductor layer apart from each other;
a third nitride semiconductor layer between the source electrode and the drain electrode, the third nitride semiconductor layer containing a p-type first impurity and serving as a gate; and
a fourth nitride semiconductor layer between the third nitride semiconductor layer and the drain electrode, the fourth nitride semiconductor layer containing a p-type second impurity, wherein
an average carrier concentration of the fourth nitride semiconductor layer is lower than an average carrier concentration of the third nitride semiconductor layer.

2. A nitride semiconductor device, comprising:
a substrate;
a first nitride semiconductor layer on the substrate;
a second nitride semiconductor layer on the first nitride semiconductor layer, the second nitride semiconductor layer having a greater band gap than the first nitride semiconductor layer;
a source electrode and a drain electrode on the second nitride semiconductor layer apart from each other;
a third nitride semiconductor layer between the source electrode and the drain electrode, the third nitride semiconductor layer containing a p-type first impurity and serving as a gate; and
a fourth nitride semiconductor layer between the third nitride semiconductor layer and the drain electrode, the fourth nitride semiconductor layer containing a p-type second impurity, wherein
a film thickness of the fourth nitride semiconductor layer is less than a film thickness of the third nitride semiconductor layer.

3. The nitride semiconductor device according to claim 1, wherein
the fourth nitride semiconductor layer includes a high-resistance region having a higher specific resistance than a specific resistance of the fourth nitride semiconductor layer.

4. The nitride semiconductor device according to claim 2, wherein
the fourth nitride semiconductor layer includes a high-resistance region having a higher specific resistance than a specific resistance of the fourth nitride semiconductor layer.

5. The nitride semiconductor device according to claim 3, wherein
the high-resistance region contains a third impurity.

6. The nitride semiconductor device according to claim 4, wherein
the high-resistance region contains a third impurity.

7. The nitride semiconductor device according to claim 5, wherein
the third impurity in the high-resistance region has a peak concentration of $2 \times 10^{18}$ cm$^{-3}$ or more.

8. The nitride semiconductor device according to claim 5, wherein
the third impurity in the high-resistance region has an average concentration of $1 \times 10^{17}$ cm$^{-3}$ or more.

9. The nitride semiconductor device according to claim 3, wherein
the high-resistance region has a thickness of 20 nm or more.

10. The nitride semiconductor device according to claim 5, wherein
the high-resistance region has a thickness of 20 nm or more and the third impurity in the high-resistance region has a peak concentration of $2 \times 10^{18}$ cm$^{-3}$ or more.

11. The nitride semiconductor device according to claim 5, wherein
the third impurity is at least one of F, B, Ar, He, Fe, Cr, Zn, Ca, Ti, or H.

12. The nitride semiconductor device according to claim 1, wherein
a second drain electrode electrically connected to the drain electrode is on the fourth nitride semiconductor layer.

13. The nitride semiconductor device according to claim 1, wherein
the drain electrode covers a top part of the fourth nitride semiconductor layer.

14. The nitride semiconductor device according to claim 3, wherein
a second drain electrode electrically connected to the drain electrode is on the fourth nitride semiconductor layer, and
the second drain electrode is in contact with both the high-resistance region and the fourth nitride semiconductor layer.

15. The nitride semiconductor device according to claim 3, wherein
a second drain electrode electrically connected to the drain electrode is on the fourth nitride semiconductor layer, and
of the high-resistance region and the fourth nitride semiconductor layer, only the high-resistance region is in contact with the second drain electrode.

16. The nitride semiconductor device according to claim 3, wherein
the drain electrode covers a top part of the fourth nitride semiconductor layer and is in contact with both the high-resistance region and the fourth nitride semiconductor layer.

17. The nitride semiconductor device according to claim 3, wherein
the drain electrode covers a top part of the fourth nitride semiconductor layer, and
of the high-resistance region and the fourth nitride semiconductor layer, only the high-resistance region is in contact with the drain electrode.

18. The nitride semiconductor device according to claim 1, wherein
the second nitride semiconductor layer includes a recess part under the third nitride semiconductor layer.

* * * * *